(12) United States Patent
Yang et al.

(10) Patent No.: US 12,262,642 B2
(45) Date of Patent: Mar. 25, 2025

(54) METHOD OF FABRICATING MAGNETO-RESISTIVE RANDOM ACCESS MEMORY (MRAM)

(71) Applicant: TAIWAN SEMICONDUCTOR MANUFACTURING COMPANY, LTD., Hsinchu (TW)

(72) Inventors: Chang-Lin Yang, Hsinchu (TW); Chung-Te Lin, Hsinchu (TW); Sheng-Yuan Chang, Hsinchu (TW); Han-Ting Lin, Hsinchu (TW); Chien-Hua Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/512,515

(22) Filed: Nov. 17, 2023

(65) Prior Publication Data
US 2024/0090336 A1    Mar. 14, 2024

Related U.S. Application Data

(63) Continuation of application No. 17/231,320, filed on Apr. 15, 2021, now Pat. No. 11,849,644.

(51) Int. Cl.
| | |
|---|---|
| *H10N 50/01* | (2023.01) |
| *H10B 61/00* | (2023.01) |
| *H10N 50/80* | (2023.01) |

(52) U.S. Cl.
CPC ............ *H10N 50/01* (2023.02); *H10B 61/00* (2023.02); *H10N 50/80* (2023.02)

(58) Field of Classification Search
CPC ........ H10N 50/01; H10N 50/80; H10N 50/10; H10B 61/00
See application file for complete search history.

(56) References Cited

U.S. PATENT DOCUMENTS

| | | | |
|---|---|---|---|
| 10,707,413 B1 | 7/2020 | Dutta et al. | |
| 2006/0192235 A1* | 8/2006 | Drewes | H10N 50/10 257/E27.005 |
| 2017/0062709 A1* | 3/2017 | Kim | H10N 50/80 |

* cited by examiner

*Primary Examiner* — Shih Tsun A Chou
(74) *Attorney, Agent, or Firm* — Birch, Stewart, Kolasch & Birch, LLP

(57) ABSTRACT

A method for fabricating magnetoresistive random-access memory cells (MRAM) on a substrate is provided. The substrate is formed with a magnetic tunneling junction (MTJ) layer thereon. When the MTJ layer is etched to form the MRAM cells, there may be metal components deposited on a surface of the MRAM cells and between the MRAM cells. The metal components are then removed by chemical reaction. However, the removal of the metal components may form extra substances on the substrate. A further etching process is then performed to remove the extra substances by physical etching.

20 Claims, 18 Drawing Sheets

METHOD OF FABRICATING MAGNETO-RESISTIVE RANDOM ACCESS MEMORY (MRAM)

PRIORITY CLAIM AND CROSS-REFERENCE

This application is a continuation of U.S. patent application Ser. No. 17/231,320, which was filed on Apr. 15, 2021, and incorporated by reference herein in its entirety.

BACKGROUND

Semiconductor memory devices are widely used in integrated circuits (ICs) to store digital data for electronic applications. Magneto-resistive random-access memory (MRAM) device is one type of semiconductor memory device that combines semiconductor technology with magnetic materials and devices. An MRAM cell includes a magnetic tunnel junction (MTJ) structure having a variable resistance, and being located between two electrodes. The MTJ structure changes its resistive state based on the directions of magnetic moments of two magnetic layers thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
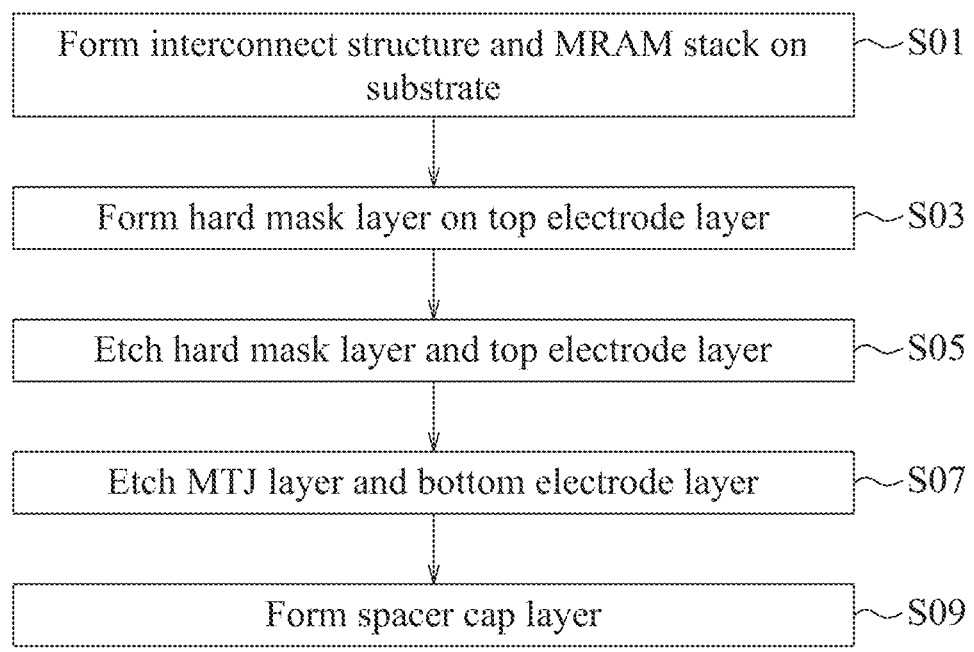
FIG. 1 is a flow chart illustrating steps of a process of fabricating multiple MRAM cells in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) devices have multiple MRAM cells arranged in array. Typically, an MRAM cell includes lower and upper electrodes and a magnetic tunnel junction (MTF) disposed therebetween. In some embodiments, the MTJ structure may be vertically arranged relative to a back-end-of-the-line (BEOL) metal stack. In some embodiments, the MTJ structure includes a reference magnetic layer and a free magnetic layer, which are vertically separated by an insulating tunnel barrier layer, such that the magnetic orientation of the reference magnetic layer may be static or fixed, and the magnetic orientation of the free magnetic layer may be capable of switching between a parallel configuration and an anti-parallel configuration, with respect to that of the reference magnetic layer. The parallel configuration allows the MRAM cell to digitally store data as a first bit value (e.g., a logical "0") in a low resistance state. On the other hand, in the anti-parallel configuration, the MRAM cell may digitally store data as a second bit value (e.g., a logical "1") in a high resistance state.

Figure 2:
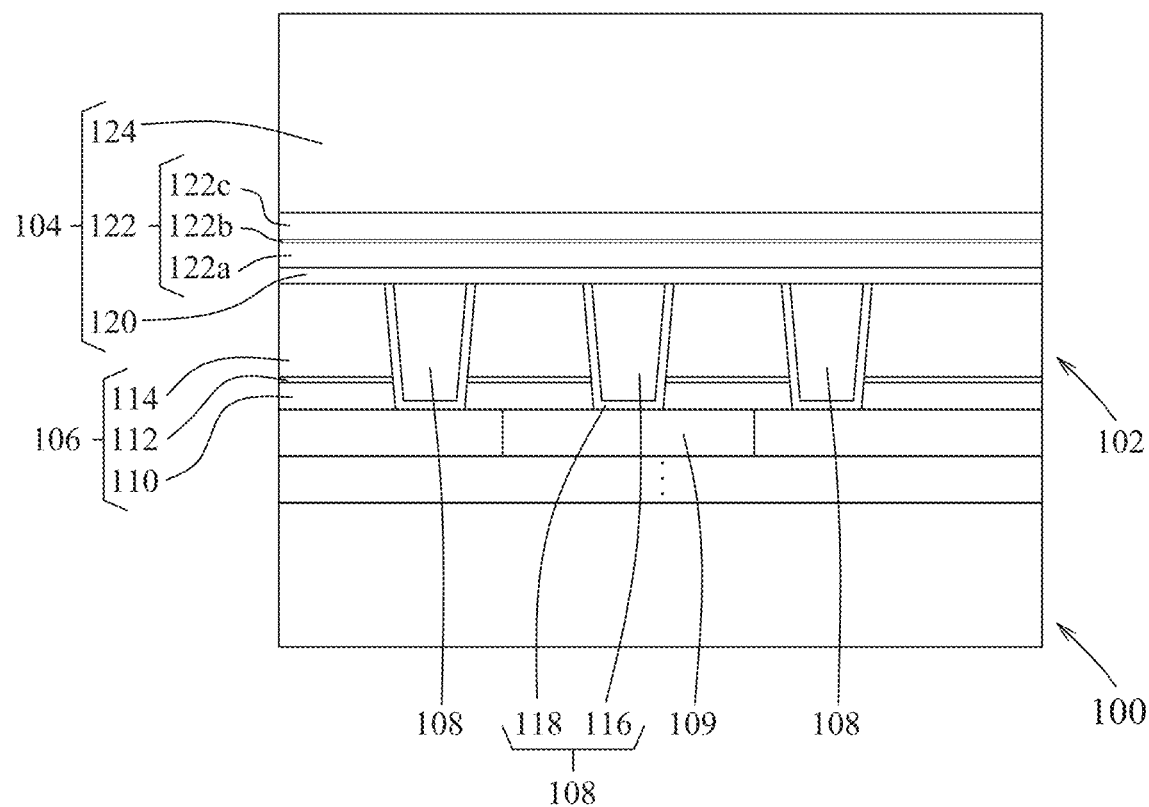
FIGS. 2 through 6 are schematic views that illustrate the process in accordance with some embodiments.

Referring to FIGS. 1 and 2, a process flow for fabricating MRAM cells on a substrate 100 is illustrated in accordance with some embodiments. The substrate 100 may be a bulk semiconductor substrate or a semiconductor-on-insulator (SOI) substrate, which may be doped (e.g., with a p-type or an n-type dopant) or undoped. In some embodiments, an SOI substrate includes a layer of a semiconductor material formed on an insulator layer. The insulator layer may be a buried oxide (BOX) layer, a silicon oxide layer or any other suitable layer. The insulator layer may be provided on a suitable substrate, such as silicon, glass or the like. The substrate 100 may be made of a suitable semiconductor material, such as silicon or the like. In some embodiments, the substrate 100 is a silicon wafer; and in other embodiments, the substrate 100 is made of a compound semiconductor such as silicon carbide, gallium arsenic, indium arsenide, indium phosphide or other suitable materials. In still other embodiments, the substrate 100 is made of an alloy semiconductor such as GaAsP, AlInAs, AlGaAs, GaInAs, GaInP, GaInAsP or other suitable materials.

In some embodiments, the substrate 100 includes various p-type doped regions and/or n-type doped regions, such as p-type wells, n-type wells, p-type source/drain features and/or n-type source/drain features, formed by a suitable process such as ion implantation, thermal diffusion, a combination thereof, or the like. In some embodiments, the substrate 100 may include other functional elements such as resistors, capacitors, diodes, transistors, and/or the like. The transistors are, for example, field effect transistors (FETs), such as planar FETs and/or 3D FETs (e.g., Fin field effect transistors (FinFETs)). The substrate 100 may include lateral isolation features (e.g., shallow trench isolation (STI)) configured to separate various functional elements formed on and/or in the substrate 100.

In the illustrative embodiment, an interconnect structure 102 and an MRAM stack 104 are formed on the substrate 100 (step S01). The interconnect structure 102 includes an isolation structure 106 and a plurality of interconnect features (e.g., vias 108) formed in the isolation structure 106. The isolation structure 106 is exemplified to include, but not limited to, a glue layer 110, an etch stop layer 112 and an isolation layer 114. The etch stop layer 112 may be used in an etching process for forming the vias 108, may be made of, for example but not limited to, aluminum oxide ($AlO_x$), other suitable materials, or any combination thereof, and may be formed by chemical vapor deposition (CVD), physical vapor deposition (PVD) or other suitable process. The glue layer 110 may be formed to increase adhesion between the etch stop layer 112 and the substrate 100, may be made of, for example but not limited to, silicon carbide (SiC), silicon oxide ($SiO_2$), silicon oxycarbide (SiOC), silicon nitride (SiN), silicon carbon nitride (SiCN), silicon oxynitride (SiON), silicon oxycarbon nitride (SiOCN) or other similar materials, and may be formed by CVD, PVD or other suitable process. The isolation layer 114 is formed to isolate the vias 108 from each other, and may be made of, for example but not limited to, un-doped silicate glass (USG), silicon oxide, other suitable materials, or a combination thereof. In the illustrative embodiment, the vias 108 are formed to electrically connect metal lines of the substrate 100 (e.g., a metal line 109) to the MRAM stack 104 that is formed over the interconnect structure 102. In some embodiments, the glue layer 110 may have a thickness in a range from about 100 angstroms to about 300 angstroms, the etch stop layer 112 may have a thickness in a range from about 10 angstroms to about 200 angstroms, and the isolation layer 114 may have a thickness in a range from about 400 angstrom to about 700 angstroms, but this disclosure is not limited in this respect. In the illustrative embodiment, each of the vias 108 may include, for example but not limited to, a metal layer 116 and a glue layer 118, where the glue layer 118 is formed between the metal layer 116 and the isolation structure 106. The metal layer 116 may be made of aluminum (Al), copper (Cu), gold (Au), tungsten (W), other suitable metal or metal alloy materials, or any combination thereof, which may be formed by atomic layer deposition (ALD), plasma enhanced CVD (PECVD), PVD, or other suitable deposition process. The glue layer 118 may be made of tantalum nitride (TaN), other suitable materials, or a combination thereof, and may be formed by ALD, PECVD, PVD, or other suitable processes.

In the illustrative embodiment, the MRAM stack 104 includes a bottom electrode layer 120, a magnetic tunneling junction (MTJ) layer 122 and a top electrode layer 124 that are stacked from bottom to top in the given order. In some examples, the bottom electrode layer 120 may be made of tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu), other suitable conductive materials, or a combination thereof, and may be formed by PVD, CVD, ALD, spin-on coating or any other suitable process. In some embodiments, the bottom electrode layer 120 may have a thickness in a range from about 50 angstroms to about 300 angstroms, but other range values are also within the scope of this disclosure. In some embodiments, the top electrode layer 124 may be made of tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu), other suitable conductive materials, or a combination thereof, and may be formed by PVD, CVD, ALD, spin-on coating or any other suitable deposition process. In some embodiments, the MTJ layer 122 may be composed of multiple layers which are stacked together and each of which includes, for example but not limited to, ruthenium (Ru), cobalt (Co), iron (Fe), boron (B), magnesium oxide (MgO), platinum (Pt), other suitable materials, or any combination thereof. In some embodiments, the MTJ layer 122 may include, for example but not limited to, a first ferromagnetic layer 122a arranged over the bottom electrode layer 120, a tunnel barrier layer 122b arranged over the first ferromagnetic layer 122a, and a second ferromagnetic layer 122c arranged over the tunnel barrier layer 122b. In some embodiments, the first ferromagnetic layer 122a is a pinned layer (also called reference layer), the second ferromagnetic layer 122c is a free layer, and an anti-ferromagnetic (AFM) layer (not shown) is arranged under the first ferromagnetic layer 122a and above the bottom electrode layer 120. In some other embodiments, the first ferromagnetic layer 122a is a free layer, the second ferromagnetic layer 122c is a pinned layer, and the AFM layer (not shown) is arranged under the second ferromagnetic layer 122c and above the tunnel barrier layer 122b. In some embodiments, the MTJ layer 122 may include additional layers, such as cap layers that are formed between the top electrode layer 124 and the second ferromagnetic layer 122c. The cap layers may include, for example but not limited to, layers of MgO, Ta, Ru, CoFeB, other suitable materials, or any combination thereof.

The AFM layer may be made of platinum manganese (PtMn), iridium manganese (IrMn), rhodium manganese (RhMn), iron manganese (FeMn), other suitable materials, or any combination thereof. The ferromagnetic layer arranged on the AFM layer can be used as a pinned layer because the magnetic moment of the pinned layer is pinned in a particular direction by the AFM layer. The AFM layer may be formed using various deposition processes such as CVD, PVD, ALD, or any other suitable process. The pinned layer (i.e., one of the first ferromagnetic layer 122a and the second ferromagnetic layer 122c) may be made of, for example but not limited to, CoFeB, CoFeTa, NiFe, Co, CoFe, CoPt, CoPd, FePt, Ru, Ta, TaN, or other alloys of Ni, Co and Fe, other suitable materials, or any combination thereof. The pinned layer may be formed using various deposition processes such as CVD, PVD, or ALD process. The free layer (i.e., the other one of the first ferromagnetic layer 122a and the second ferromagnetic layer 122c) may be made of, for example but not limited to, CoFeB, CoFeTa, NiFe, Co, CoFe, CoPt, CoPd, FePt, Ru, Ta, TaN, or other alloys of Ni, Co and Fe, other suitable materials, or a combination thereof. The free layer may be formed using various deposition processes such as CVD, PVD, or ALD process. The tunnel barrier layer 122b may be made of a dielectric material, such as magnesium oxide (MgO), aluminum oxide ($AlO_x$ (e.g., $Al_2O_3$)), aluminum nitride (AlN), aluminum oxynitride (AlON), other suitable materials, or a combination thereof. The tunnel barrier layer 122b may be formed using various deposition processes such as CVD, PVD, or ALD process.

Figure 3:
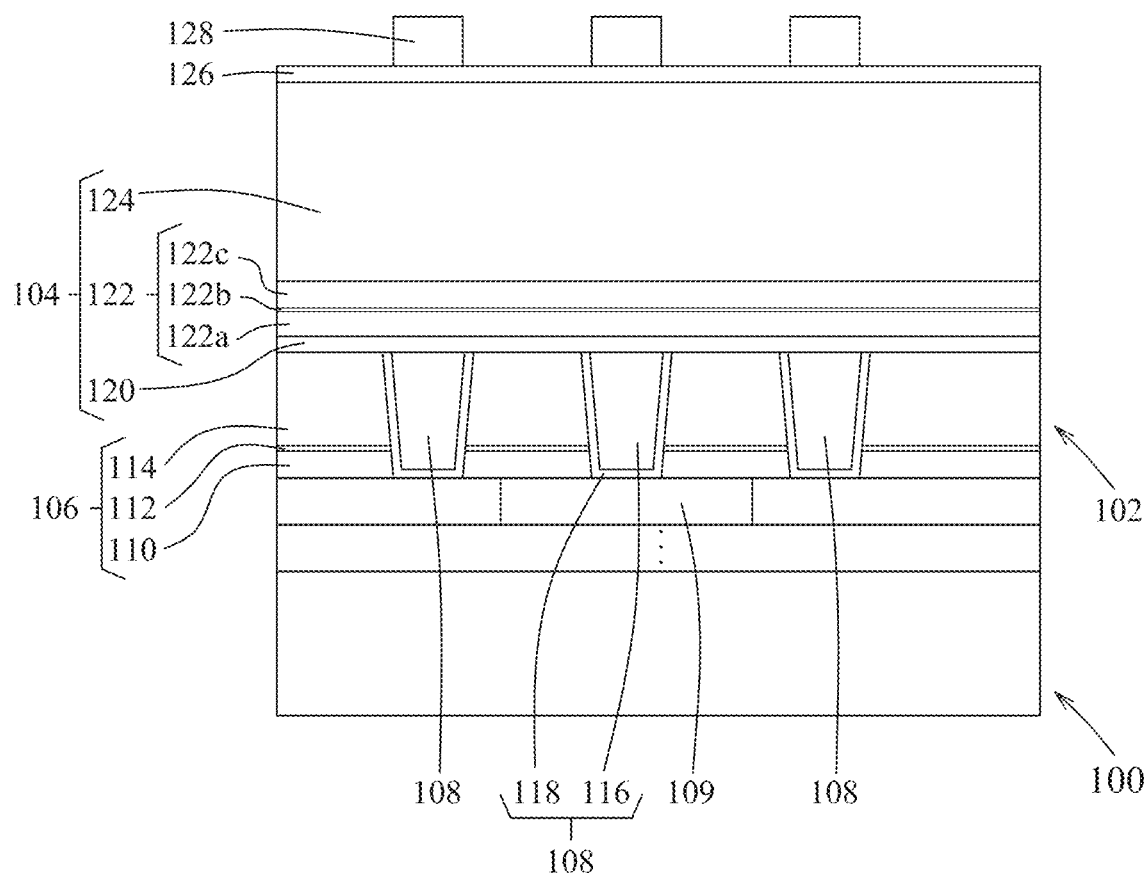

Referring to FIGS. 1 and 3, in step S03, a hard mask layer 126 is formed on the top electrode layer 124, and a photoresist layer 128 is formed on the hard mask layer 126 for patterning the hard mask layer 126 and the top electrode layer 124. In some embodiments, the hard mask layer 126 may be made of, for example, an oxide material (e.g., $SiO_2$, etc.), a nitride material (e.g., $Si_3N_4$, etc.), other suitable materials, or any combination thereof, which has a high etching selectivity relative to the top electrode layer 124, so the hard mask layer 126 can protect the desired part of the top electrode layer 124 (i.e., the part under the photoresist layer 128) when the photoresist layer 128 is removed during the subsequent etching of the top electrode layer 124, and thus the pattern of the top electrode layer 124 that is defined by the photoresist layer 128 can be correctly formed as desired.

Figure 4:
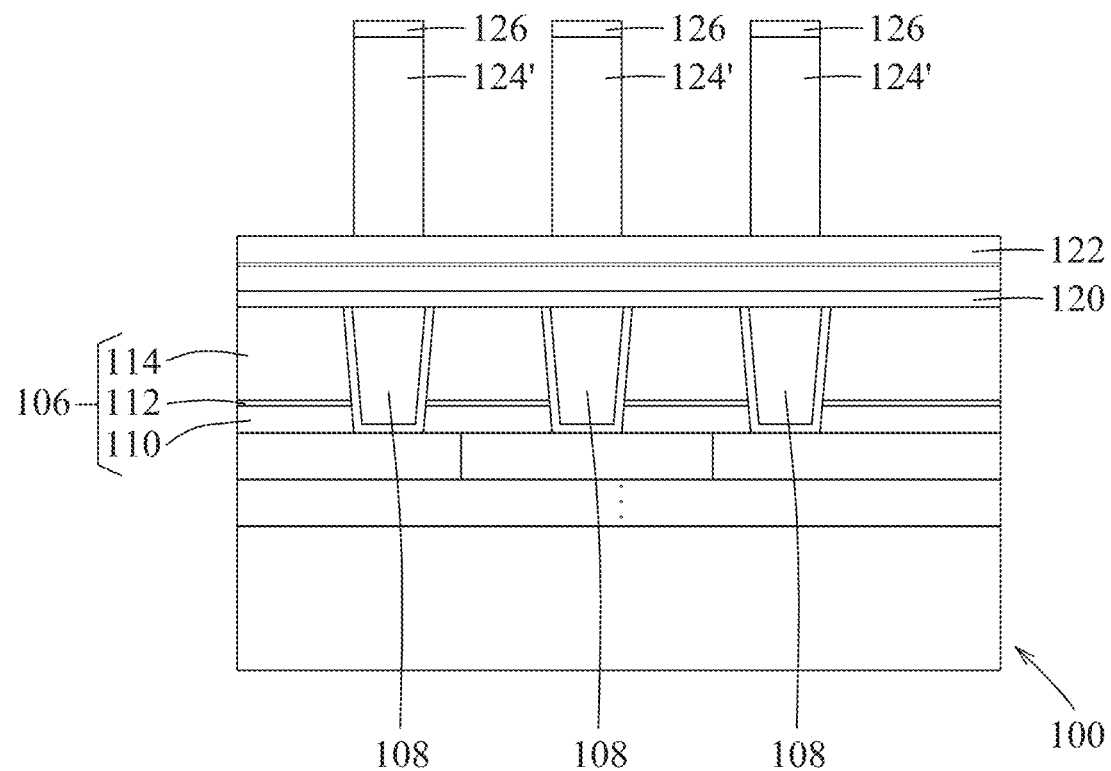

Further referring to FIG. 4, in step S05, the hard mask layer 126 is etched using the photoresist layer 128 serving as a mask, and the top electrode layer 124 is etched with the etched hard mask layer 126 and the photoresist layer 128 serving as a mask, so as to form a plurality of top electrode features 124' that are in a form of, for example but not limited to, pillars. In some embodiments, the hard mask layer 126 may be etched using wet etching, dry etching, reactive-ion etching (RIE), and/or other suitable processes. In some embodiments, the top electrode layer 124 may be etched using wet etching, dry etching, RIE, and/or other suitable processes.

Figure 5:
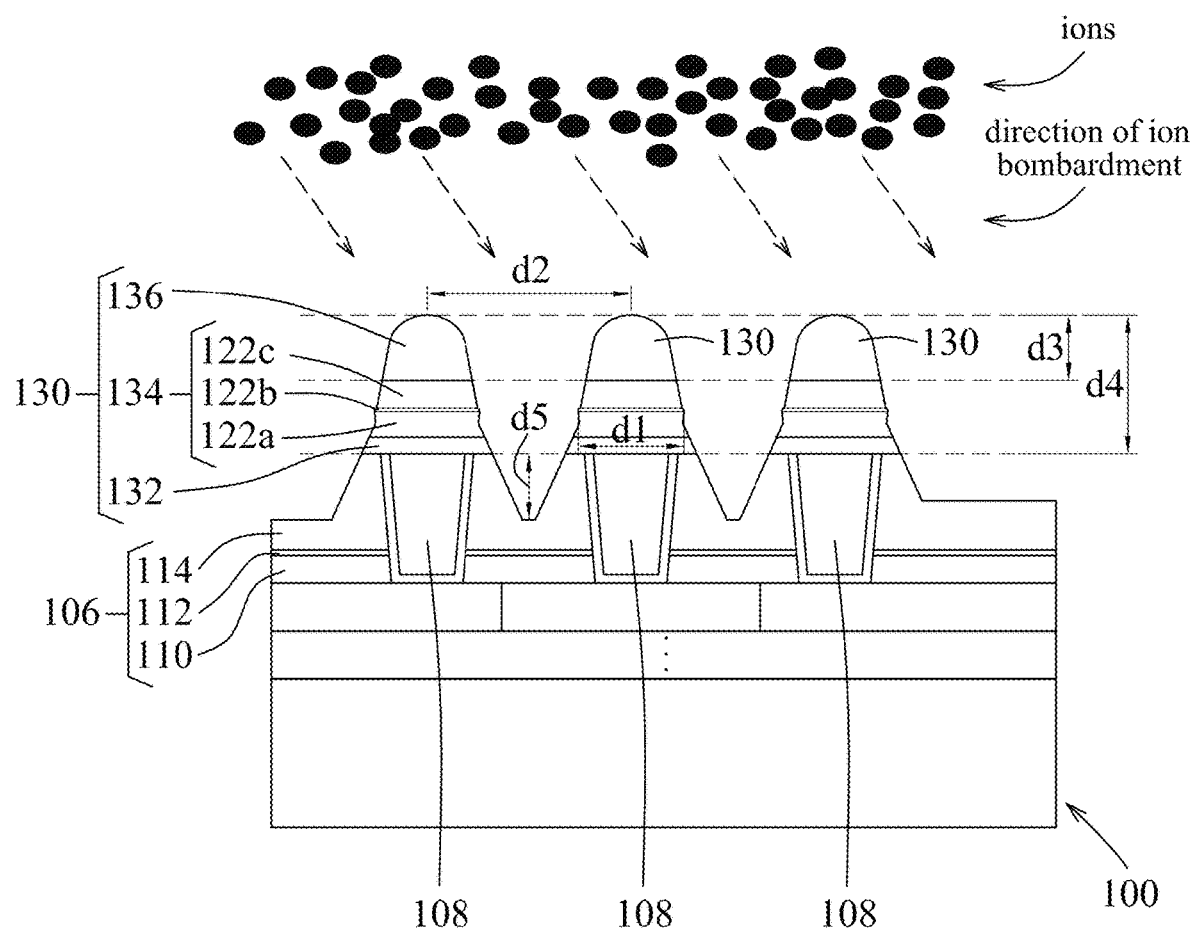

Further referring to FIG. 5, in step S07, the MTJ layer 122 and the bottom electrode layer 120 are etched with the remaining part of the hard mask layer 126 and the top electrode features 124' serving as a hard mask in the etching process (also called trimming process), so as to form a plurality of MRAM cells 130. Each of the MRAM cells 130 includes a bottom electrode 132 resulting from etching the bottom electrode layer 120, an MTJ stack 134 resulting from etching the MTJ layer 122, and a top electrode 136 resulting from etching the top electrode layer 124. The etching of the MTJ layer 122 and the bottom electrode layer 120 may be performed using, for example, ion beam etching (IBE), RIE, atomic layer etching (ALE), or other suitable etching processes. In some embodiments, the MRAM cells 130 may have, for example but not limited to, the following dimensions: a width (d1) of the tunnel barrier layer 122b of each of the MRAM cells 130 being in a range from about 30 nm to about 60 nm; a pitch (d2) of adjacent two MRAM cells 130 being in a range from about 70 nm to about 180 nm; a height (d3) of the top electrode 136 of each of the MRAM cells 130 being in a range from about 200 angstroms to about 450 angstroms; and a height (d4) of each of the MRAM cells 130 being in a range from about 500 angstroms to about 850 angstroms, but other range values are also within the scope of this disclosure. In some embodiments, a depth (d5) of each recess formed in the isolation layer 114 and between adjacent two MRAM cells 130 is in a range from about 100 angstroms to about 800 angstroms, but other range values are also within the scope of this disclosure. When RIE or ALE is used to etch the MTJ layer 122 and the bottom electrode layer 120 in step S07, a suitable reactant gas may include, for example but not limited to, $CH_3OH$ (also known as MeOH), fluorine (F), chlorine (Cl), bromine (Br), iodine (I), $SiCl_4$, $SiCl_2$, SiHCl, $SiH_2Cl_2$, $HCl_3Si$, $SiH_4$, $CH_3OH$, $C_2H_5OH$, $CH_xO_y$ (e.g., $C_3H_8O$, $C_4H_{10}O$, $C_3H_6O$, etc.), $C_xH_y$ (e.g., $CH_4$, $C_2H_6$, $C_3H_8$, $C_4H_{10}$, etc.), $Si_xCl_y$, $Si_xF_y$, $Si_xBr_y$, $Si_xI_y$, $CO_x$, $CF_x$, $CBr_x$, $O_2$, $N_2$, $H_2$, OH, other suitable gases, or any combination thereof. However, although RIE can also be used in this step in some embodiments, its chemical etching ability may cause chemical damage to the MRAM cells 130 and thus may lead to poor profile of the MRAM cells 130 when the cell size is small. In some embodiments, the RIE process may be controlled to reduce its chemical etching ability to induce less chemical damage and thus achieve better profile control. On the other hand, IBE physically etches materials using ion bombardments, which can achieve better profile control than RIE, and thus may be suitable for forming the MRAM cells 130 of almost all dimensions, even if each of the MRAM cells 130 has a critical dimension d1 (i.e., the width of the tunnel barrier layer 122b of the MRAM cell 130) down to between about 30 nm and about 60 nm. In some embodiments, IBE may be performed using, for example but not limited to, argon (Ar), chlorine (Cl), fluorine (F), bromine (Br), iodine (I), helium (He), neon (Ne), krypton (Kr), xenon (Xe), radon (Rn), other suitable gases, or any combination thereof, with a bias voltage in a range from about 100 volts to about 400 volts, an etching angle (e.g., incident angle of incoming etchant) in a range from about 20 degrees to about 60 degrees, an etching temperature in a range from about 25° C. to about 60° C., an etching time in a range from about 200 seconds to about 400 seconds, and radio frequency (RF) power smaller than about 800 watts. In the illustrative embodiment, the etching of the MTJ layer 122 and the bottom electrode layer 120 is exemplarily performed using IBE.

Figure 6:
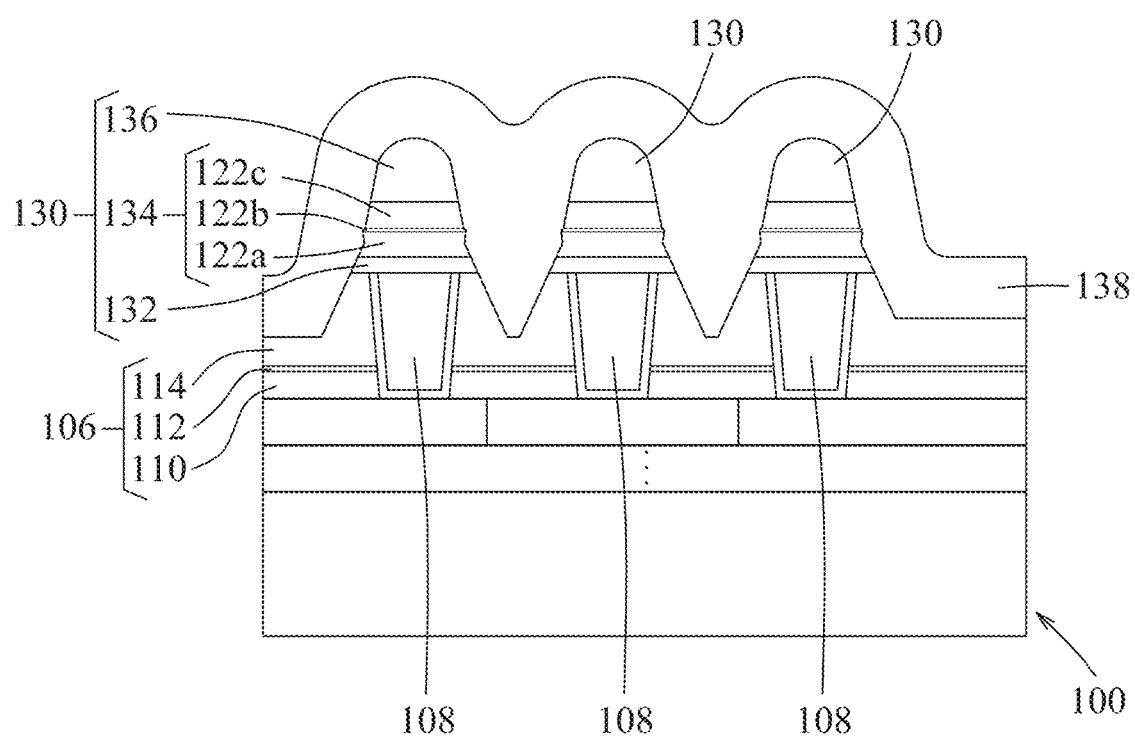

Further referring to FIG. 6, in step S09, a spacer cap layer 138 is formed over the isolation structure 106 and the MRAM cells 130. In some embodiments, the spacer layer 138 is made of, for example but not limited to, a nitride material (e.g., $Si_3N_4$, etc.), an oxide material (e.g., $SiO_2$, etc.), other suitable dielectric materials, or any combination thereof, which may be conformally deposited by various deposition processes such as CVD, PVD, ALD, or other suitable processes. The spacer cap layer 138 may protect the MTJ stack 134 of each of the MRAM cells 130 from being damaged by $H_2O$ or other chemical compounds, and may have a thickness in a range from about 500 angstroms to about 600 angstroms, but other range values are also within the scope of this disclosure.

Figure 7:
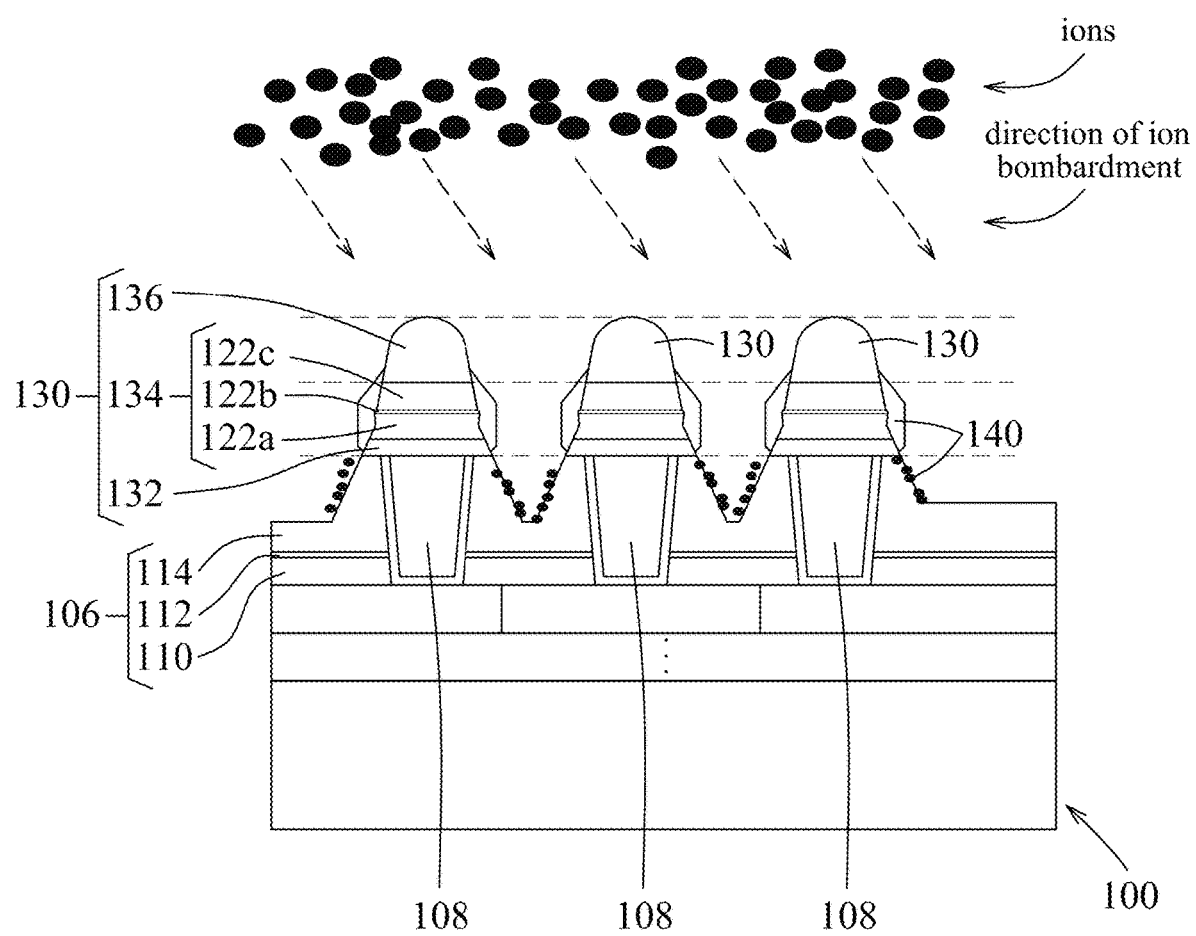
FIG. 7 is a schematic view that illustrates metal redeposition during the process in accordance with some embodiments.

However, in some embodiments employing IBE, metal redeposition may occur after the etching process in step S07 and redeposited metal components 140 on the sidewall surfaces of the MTJ stacks 134 of the MRAM cells 130 and in the recesses between the MRAM cells 130 may be formed, as illustrated in FIG. 7, where the redeposited metal components 140 may be composed of materials that are released from the bottom electrode layer 120, the MTJ layer 122 and the top electrode layer 124 (see FIG. 3) during the etching in step S07. In addition, since IBE is a physical etching technique using ion bombardment (i.e., anisotropic etching), IBE may not uniformly remove the redeposited metal components 140 from every face of the MTJ stacks 134 because of, for example, the shadowing effect. For each of the MRAM cells 130, the redeposited metal components 140 on the sidewall of the MTJ stack 134 may create an electrical connection path between the first ferromagnetic layer 122a and the second ferromagnetic layer 122c of the MTJ stack 134, which may result in current leakage between the first ferromagnetic layer 122a and the second ferromagnetic layer 122c, and the redeposited metal components 140 in each recess between adjacent two MRAM cells 130 may cause cell-to-cell current leakage (i.e., current leakage between the adjacent two MRAM cells 130). In some embodiments, the redeposited metal components 140 may include, for example but not limited to, Ru, Ta, Ti, Mo, Co, Fe, Pt, Mg, Ni, Cr, and/or other metal components that are included in the interconnect structure 102 and the MRAM stack 104 (see FIG. 3).

Figure 8:
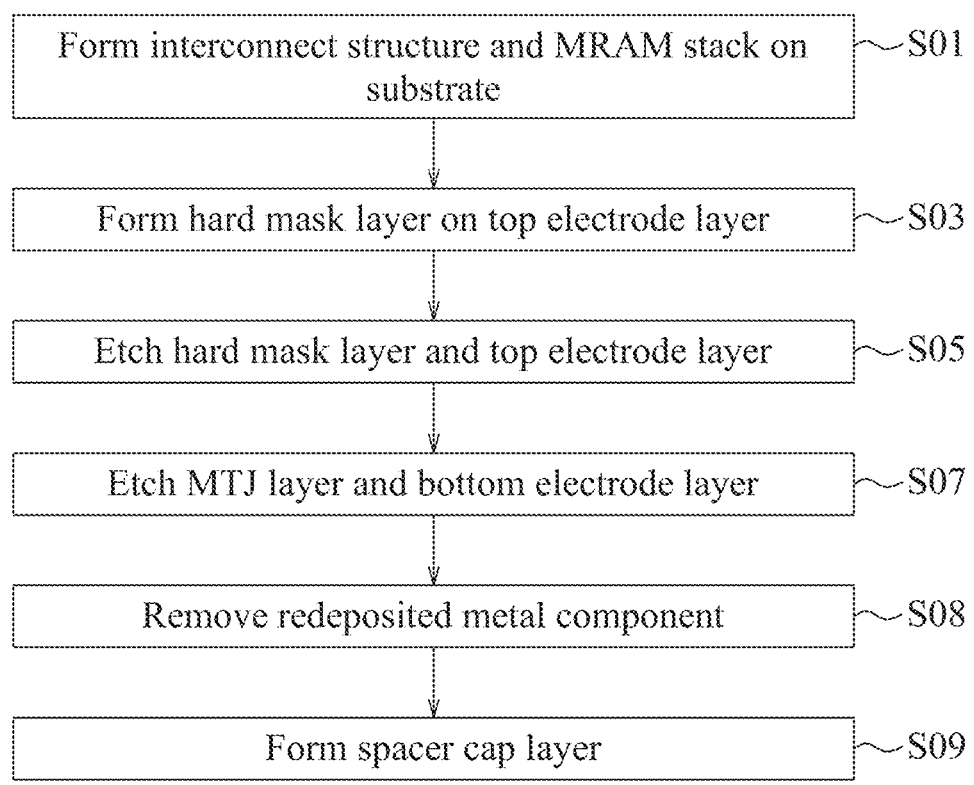
FIG. 8 is a flow chart that illustrates a variation of the process in accordance with some embodiments.
Figure 9:
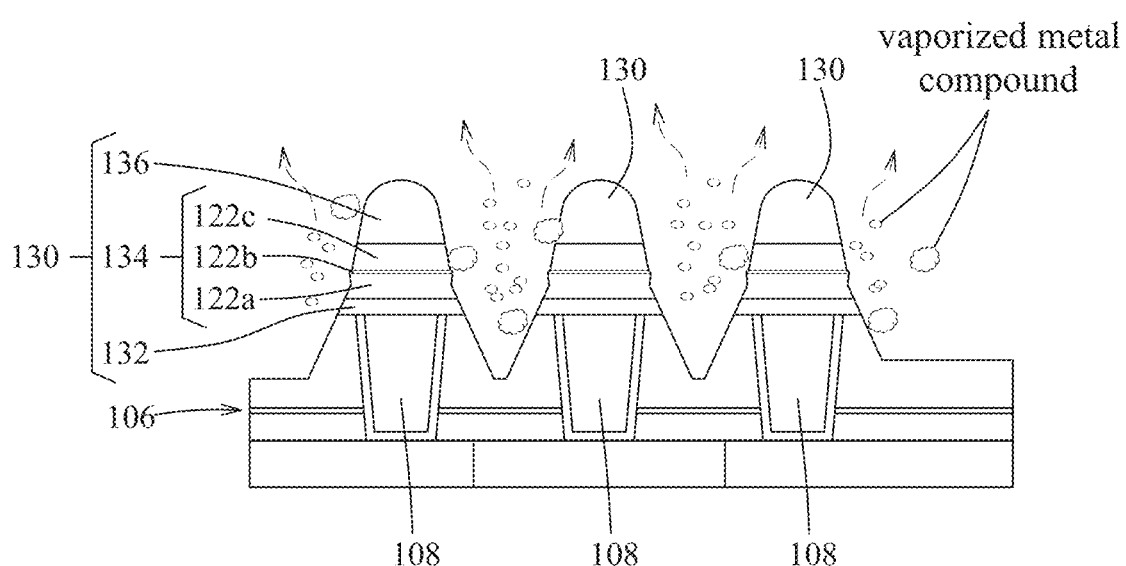
FIG. 9 is a schematic view that illustrates removal of redeposited metal in accordance with some embodiments.

In order to reduce the amount of the redeposited metal components 140 that may create current leakage paths and degrade the characteristics of the MRAM cells 130, an additional step S08 may be inserted between step S07 and step S09 in accordance with some embodiments, as shown in FIG. 8. In step S08, the redeposited metal components 140 may be removed from the MRAM cells 130 and from the recesses among the MRAM cells 130 by chemical reaction. In the illustrative embodiment, a reactant gas that reacts with the redeposited metal components 140 may be used in this step. In accordance with some embodiments, the reactant gas may include a compound of oxygen, a compound of oxygen and hydrogen, a compound of oxygen, hydrogen and carbon, a compound of halogen, or other suitable materials. In practice, the reactant gas may include, for example but not limited to, $CH_3OH$ (also known as MeOH), F, Cl, Br, I, $SiCl_4$, $SiCl_2$, $SiHCl$, $SiH_2Cl_2$, $HCl_3Si$, $SiH_4$, $CH_3OH$, $C_2H_5OH$, $CH_xO_y$ (e.g., $C_3H_8O$, $C_4H_{10}O$, $C_3H_6O$, etc.), $C_xH_y$ (e.g., $CH_4$, $C_2H_6$, $C_3H_8$, $C_4H_{10}$, etc.), $Si_xCl_y$, $Si_xF_y$, $Si_xBr_y$, $Si_xI_y$, $CO_x$, $CF_x$, $CBr_x$, $O_2$, $N_2$, $H_2$, OH, other suitable gases, or any combination thereof. In one mechanism, the redeposited metal components 140 are removed by using the reactant gas that reacts with the redeposited metal components 140 to form other metal compounds that may be vaporized and removed from the MRAM cells 130 (as illustrated in FIG. 9), so as to reduce the number of possible current leakage paths established by the redeposited metal components 140. In such a case, the metal compounds thus formed may have a boiling point lower than that of the original redeposited metal components 140, so the metal compounds are easier to be vaporized in comparison with the metal components 140. In some embodiments, the boiling point of the metal compounds is lower than a temperature of the process (e.g., RIE, ALE, and so on) used in this step, allowing the low-boiling-point metal compounds to be vaporized in the process. In one mechanism, the number of possible current leakage paths may also be reduced by using the reactant gas that reacts with the redeposited metal components 140 to form electrically insulating metal compounds. The reactant gas may be selected as being capable of inducing one or both of the abovementioned mechanisms. In one example, MeOH is selected as the reactant gas because it may react with the redeposited metal components 140 (denoted by "M" herein) to form $M(CO)_x$ and/or $M(OH)_x$ that has a lower boiling point and that is easily vaporized in comparison to the redeposited metal components 140. The vaporized $M(CO)_x$ and/or $M(OH)_x$ may be removed by a vacuum pump, so the amount of the redeposited metal components 140 is reduced. In some embodiments, the process for removing the redeposited metal components 140 may be a purge process or a flush process that uses the reactant gas without inducing plasma. In the illustrative embodiment, the redeposited metal components 140 are removed using the RIE process where the reactant gas is applied with plasma. The RIE process may be performed with, for example but not limited to, a pressure in a range from about 3 mT to about 10 mT, source power in a range from about 500 watts to about 3000 watts, a bias in a range from about 100 volts to about 750 volts, a pulsing in a range from 0 to 100% (when in 100% pulsing, the RIE reaction time equals the purge duration), a temperature in a range from about 10° C. to about 200° C., a process time smaller than 300 seconds, and a plasma type of a direct plasma or a remote plasma. Taking MeOH ($CH_3OH$) as an example of the reactant gas used in the RIE process, MeOH may be dissociated by plasma and thereby generate dissociation products such as CO, H, $CH_x$, OH, O, $CH_xO_y$, fragments, etc., where CO and OH fragments may react with the redeposited metal components 140 to form metal compounds of $M(CO)_x$ and $M(OH)_x$, which are easily vaporized. Furthermore, the oxygen that is dissociated from MeOH by plasma may oxidize the redeposited metal components 140 to form insulating metal oxide, so the number of current leakage paths can be further reduced. As a result, yield and reliability of the process of fabricating the MRAM cells 130 can be improved by leakage path reduction. In some embodiments, ALE may be used to remove the redeposited metal components 140 since ALE also has chemical etching ability to make the redeposited metal components 140 form a compound that is easily vaporized, achieving a similar effect to RIE.

It is noted that step S08 is not limited to being applicable to the process of fabricating MRAM cells, but is also applicable to processes of fabricating other electronic circuit elements that apply ion bombardment to treat a substrate to form the electronic circuit elements. In these processes, similar to the process of fabricating the MRAM cells as described above, metal components that were included in the substrate may be released from the substrate and redeposited on and between the electronic circuit elements thus formed. In order to remove these redeposited metal components, a reactant gas may be used to react with the metal components to form metal compounds that have a boiling point lower than the boiling point of the metal components (or lower than a temperature of the process, such as RIE) and that are to be vaporized subsequently, or to form insulating metal compounds to reduce the number of current leakage paths.

Figure 10:
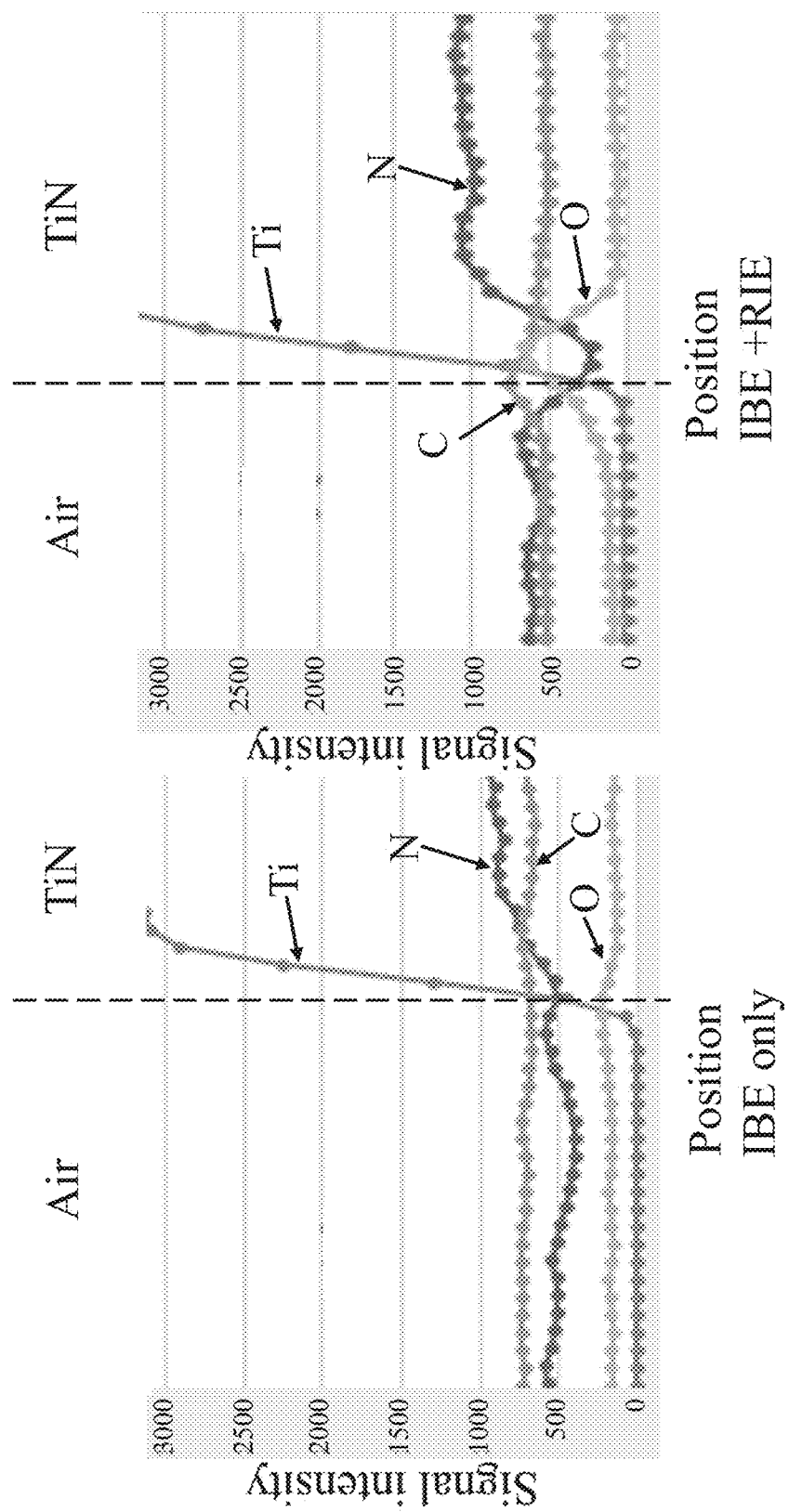
FIG. 10 is a plot that illustrates surface composition of the MRAM cells fabricated by the process in accordance with some embodiments.

FIG. 10 shows two plots that are obtained by applying energy-dispersive X-ray spectroscopy (EDS) on two samples of the MRAM cells 130 (see FIG. 9) to analyze surface composition of the samples at the sidewalls of the top electrodes 136 of the MRAM cells 130. The left plot in FIG. 10 corresponds to the sample of which the MRAM cells 130 are formed by IBE in step S07, and which is not subsequently treated by RIE as described in step S08. The right plot in FIG. 10 corresponds to the sample of which the MRAM cells 130 are formed by IBE in step S07, and which is subsequently treated with RIE (as described in step S08) with MeOH being used as the reactant gas. The two plots differ in that, in the right plot, the signal intensities that correspond to carbon and oxygen suddenly rise at the surface of the top electrodes 136 that are made of TiN in this example, and the detected carbon and oxygen may result from dissociation of MeOH (i.e., $CH_3OH$) and oxidation of the redeposited metal components 140, while the left plot does not show the rise of carbon and oxygen signals.

Figure 11:
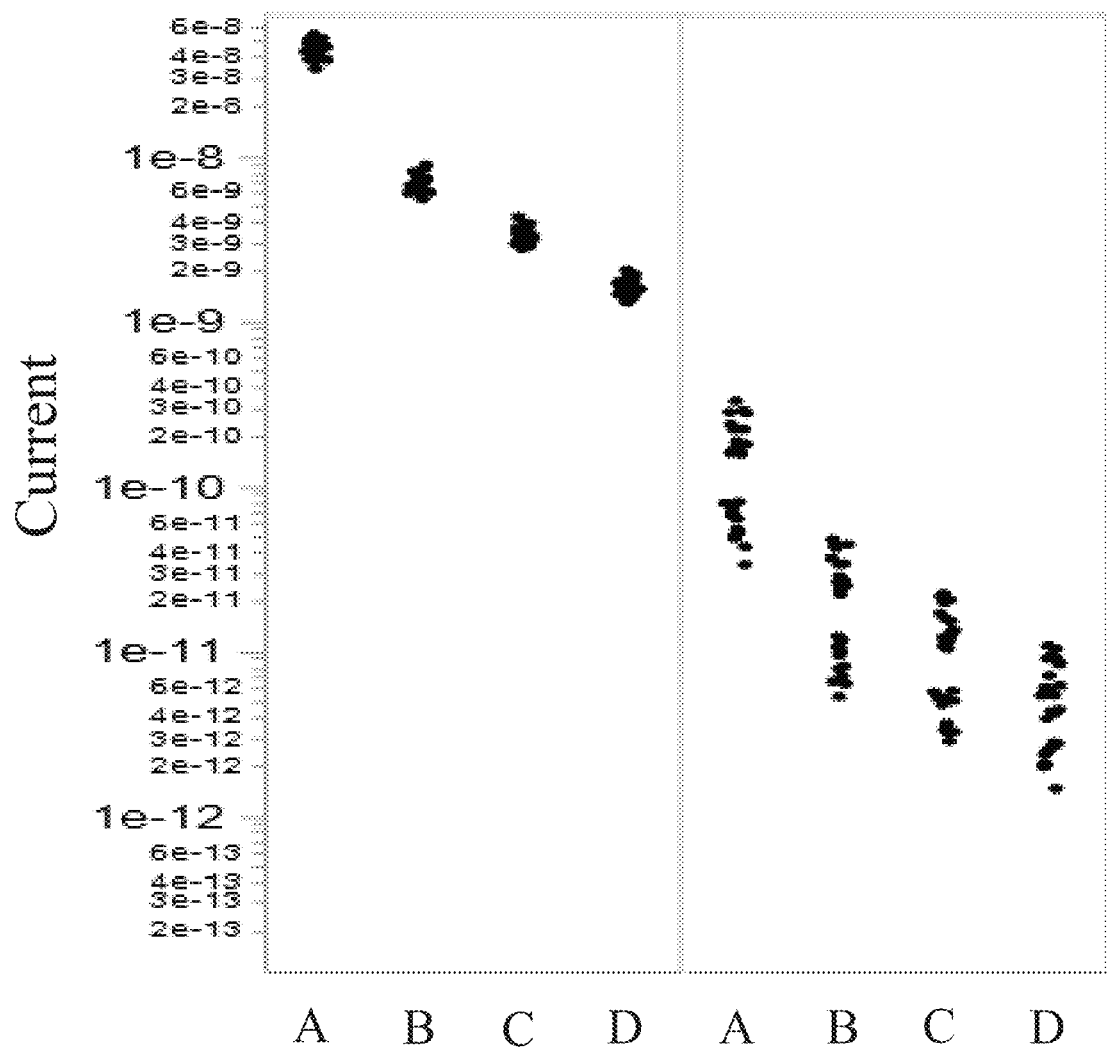
FIG. 11 is a plot that illustrates an improvement achieved by the process in terms of current leakage in accordance with some embodiments.

Referring to FIG. 11, in order to verify the improvement of the additional RIE process, multiple test dies of the MRAM cells 130 (see FIG. 9) were formed by the IBE trimming process, as described in step S07. Some of the test dies were subsequently treated by the RIE process with MeOH being used as a reactant gas, while other test dies were not treated by RIE after the IBE trimming process. Each of the test dies included four test groups A, B, C, D of the MRAM cells 130. Each of the test groups A, B, C, D was composed of multiple MRAM cells 130 that were connected in parallel (i.e., the top electrodes 136 of the MRAM cells 130 (see FIG. 9) in the same test group were connected together, and the bottom electrodes 132 of the MRAM cells 130 (see FIG. 9) in the same test group were connected together). The test groups A, B, C, D differed from each other in terms of the number of MRAM cells included therein. In the illustrative embodiments, test group A>test group B>test group C>test group D in terms of the number of MRAM cells. In the verification experiment, for each of the test groups A, B, C, D of each of the test dies, a predetermined voltage was applied between the top electrode 136 and the bottom electrode 132 of each of the MRAM cells 130 of the test group, and a current flowing therethrough was measured to obtain corresponding test data, which corresponds to one point in FIG. 11. As shown in FIG. 11, for the same test group, the currents flowing through the MRAM cells 130 that were treated by the RIE process were smaller than the currents flowing through the MRAM cells 130 that were not treated by the RIE process by about two to three orders of magnitude. Such an experiment result shows that the RIE process can significantly reduce the current leakage (including the sidewall leakage and the cell-to-cell leakage), so the yield and the reliability of the process of fabricating the MRAM cells 130 can thus be improved.

The proposed embodiments only add an additional RIE or ALE process after the IBE trimming process, and do not require modification of the structure of the MRAM cells or significant changes in the process flow, and thus the redeposited metal components 140 can be removed or reduced in number in a cost-effective way.

Figure 12:
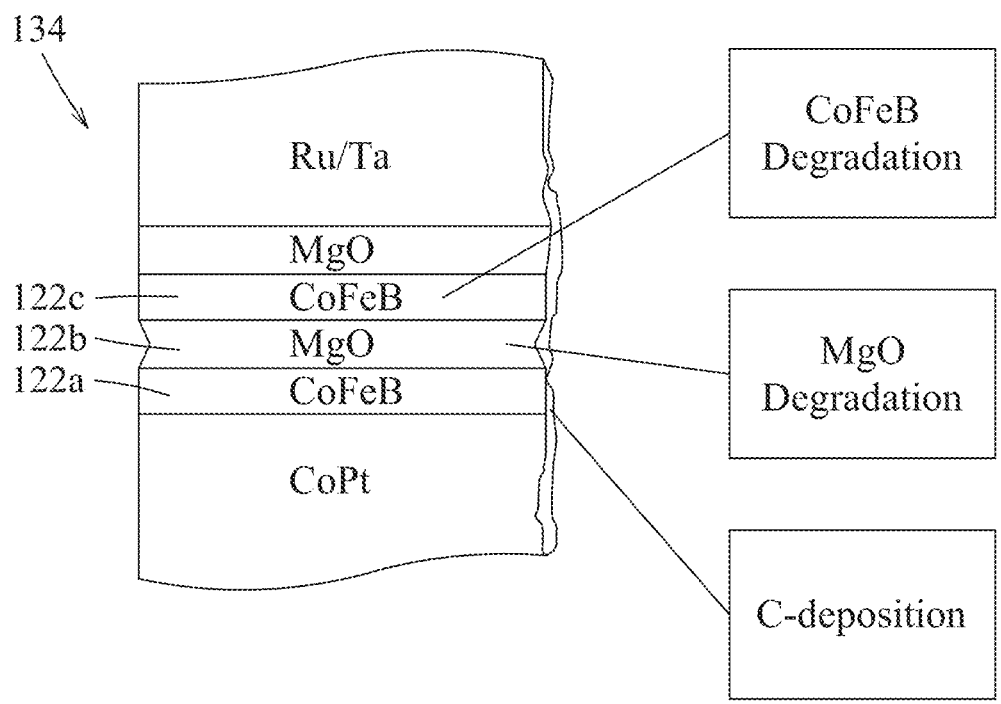
FIG. 12 is a schematic diagram that illustrates side effects which may occur during the process of removing the redeposited metal components in accordance with some embodiments.

As mentioned above, oxidizing the redeposited metal components 140 can reduce the current leakage paths, but the resultant metal oxide may change the property of the MTJ stacks 134. For example, it was observed that the metal oxide on the sidewall surfaces of the MTJ stacks 134 may make the MTJ stacks 134 break more easily, which may change the characteristics of the MTJ stacks 134 in terms of, for example but not limited to, electrical resistance and tunneling magnetoresistance (TMR). In addition, although chemical reaction can remove the redeposited metal components 140, it may also cause some chemical damages in the MTJ stacks 134 of the MRAM cells 130. As exemplified above, the MeOH may be dissociated in step S08 to generate by-products such as CO, H, $CH_x$, OH, O, $CH_xO_y$ fragments where CO and OH fragments may react with the redeposited metal components 140 to form metal compounds that are easier to be vaporized, and O fragments may react with the remaining redeposited metal components 140 to form electrically insulating metal oxide. However, the by-products of H, $CH_x$, OH, O, $CH_xO_y$ fragments may also induce extra reactions/side effects with the MTJ stacks 134. The extra reactions will be described hereinafter by taking an example where, for each MRAM cell 130, the first ferromagnetic layer 122a is the reference layer that is made of CoFeB, the tunnel barrier layer 122b is made of MgO, and the second ferromagnetic layer 122c is the pinned layer that is made of CoFeB, as illustrated in FIG. 12.

Figure 13:
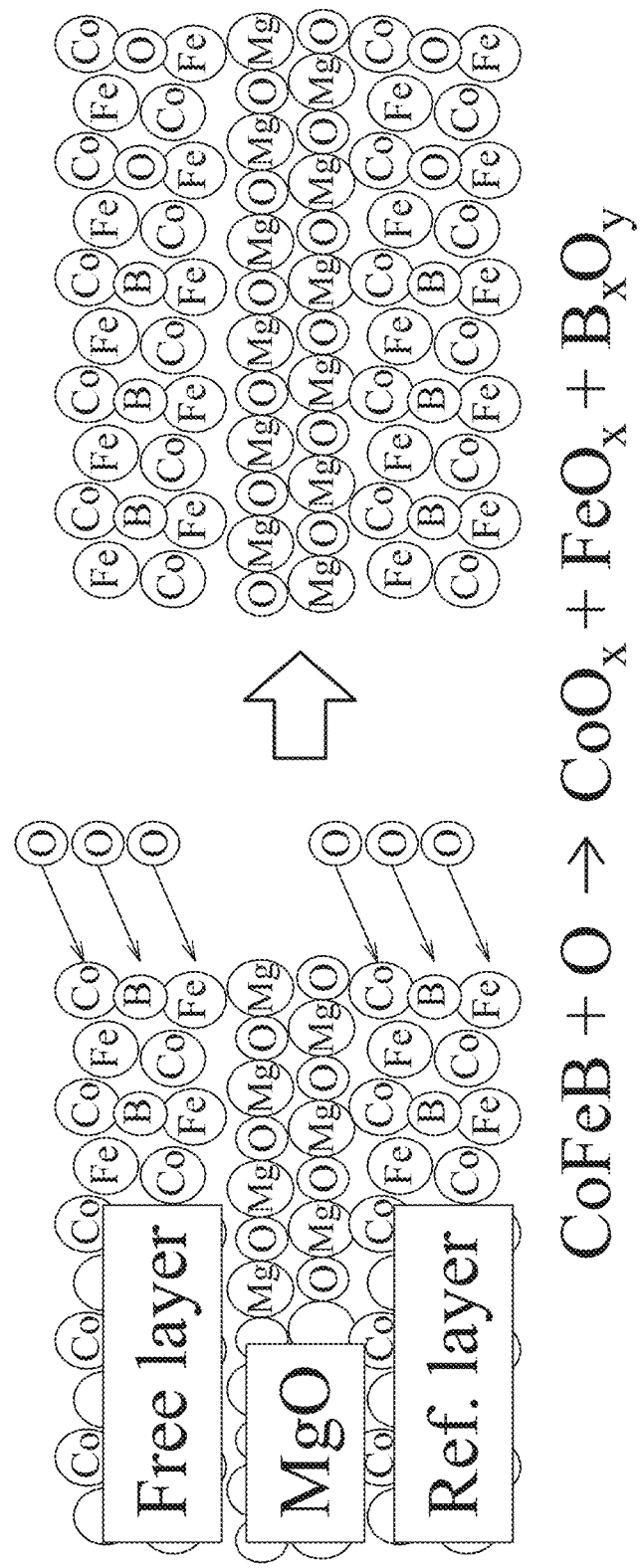
FIG. 13 is a schematic diagram that illustrates a first side effect which may occur during the process of removing the redeposited metal components in accordance with some embodiments.

Referring to FIG. 13, the first extra reaction is that CoFeB, which is a common material of the free layer (e.g., the second ferromagnetic layer 122c) and the reference layer (e.g., the first ferromagnetic layer 122a), may react with O fragments to form an oxide layer such as a layer of $CoO_x$, $FeO_x$ and/or $B_xO_y$ on the side wall surfaces of the free layer and the reference layer. In some embodiments, the oxide layer may induce deformation or distortion of the MTJ stacks 134, which can result in high electrical resistance and low TMR of the MTJ stacks 134.

Figure 14:
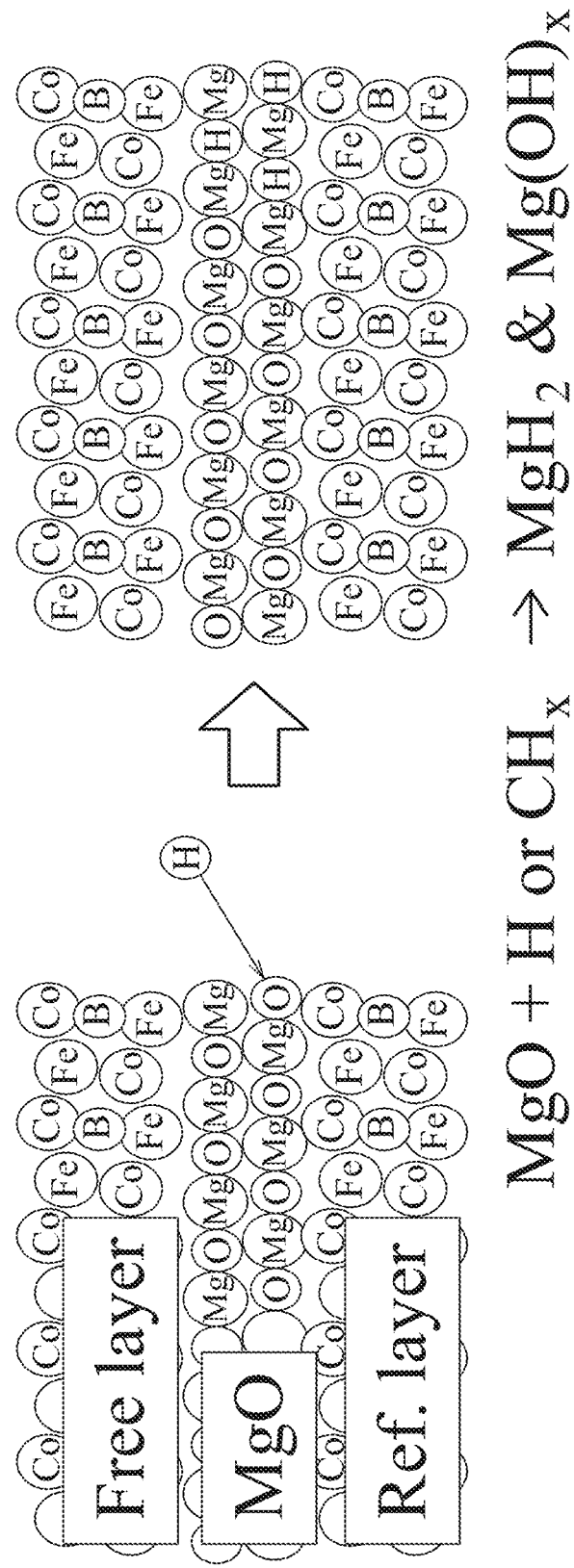
FIG. 14 is a schematic diagram that illustrates a second side effect which may occur during the process of removing the redeposited metal components in accordance with some embodiments.

Referring to FIG. 14, the second extra reaction is that MgO, which is a common material of the tunnel barrier layer 122b, may react with H or $CH_x$ fragments to form a reacted layer of, for example, $MgH_2$ and/or $Mg(OH)_x$, on the side wall surface of the tunnel barrier layer 122b. The reacted layer may induce deformation or distortion of the MTJ stacks 134, which can result in high electrical resistance and/or low TMR of the MTJ stacks 134.

Figure 15:
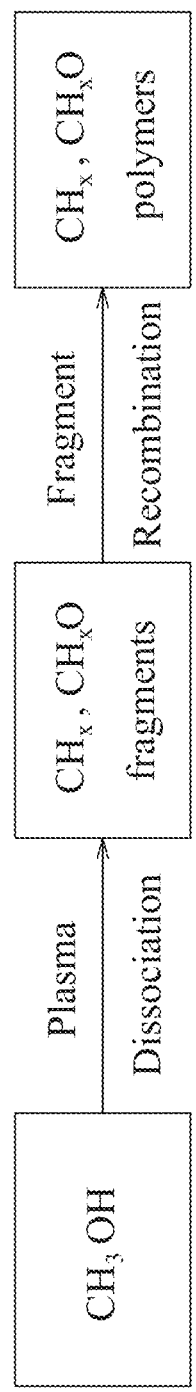
FIG. 15 is a schematic diagram that illustrates a third side effect which may occur during the process of removing the redeposited metal components in accordance with some embodiments.

Referring to FIG. 15, the third extra reaction is that $CH_x$ and $CH_xO$ fragments dissociated from $CH_3OH$ may be recombined to form $CH_x$ and $CH_xO$ polymers. Although the $CH_x$ and $CH_xO$ polymers may not create direct negative effects on the MRAM cells 130, subsequent processes may be adversely affected by these polymers. In some embodiments, when there are annealing steps in the subsequent processes, the $CH_x$ and $CH_xO$ polymers may be vaporized and may deform the device.

Figure 16:
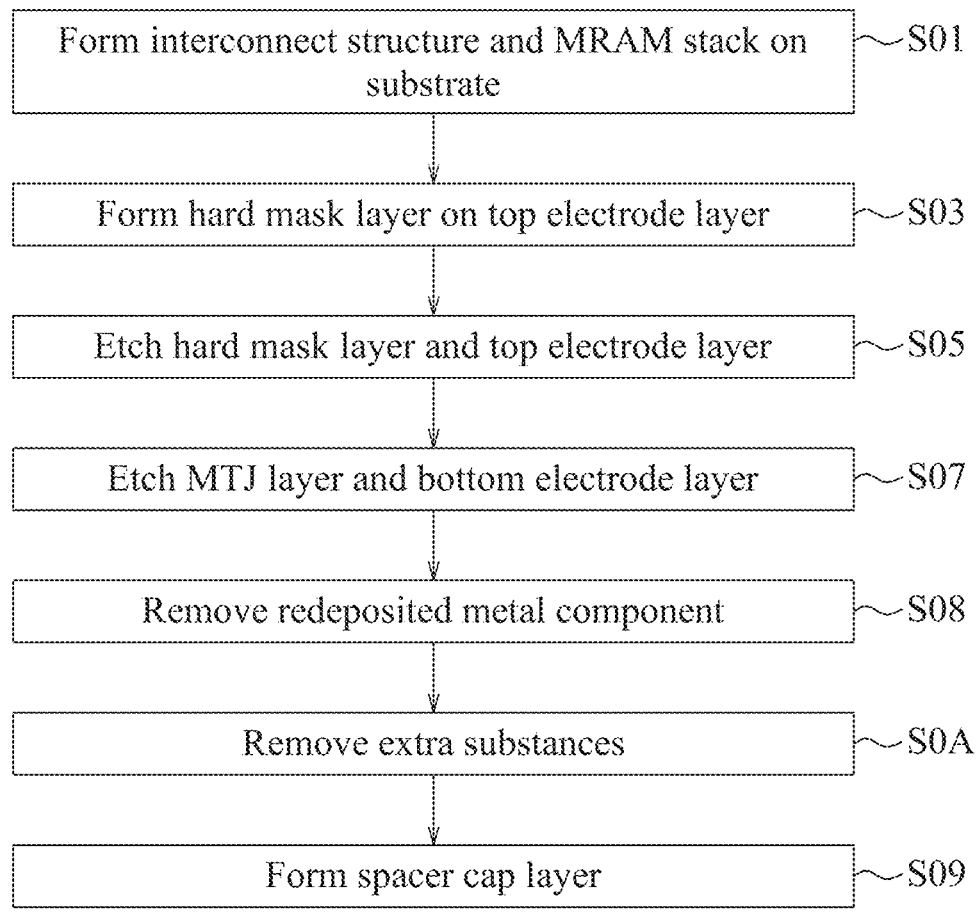
FIG. 16 is a flow chart that illustrates another variation of the process in accordance with some embodiments.
Figure 17:
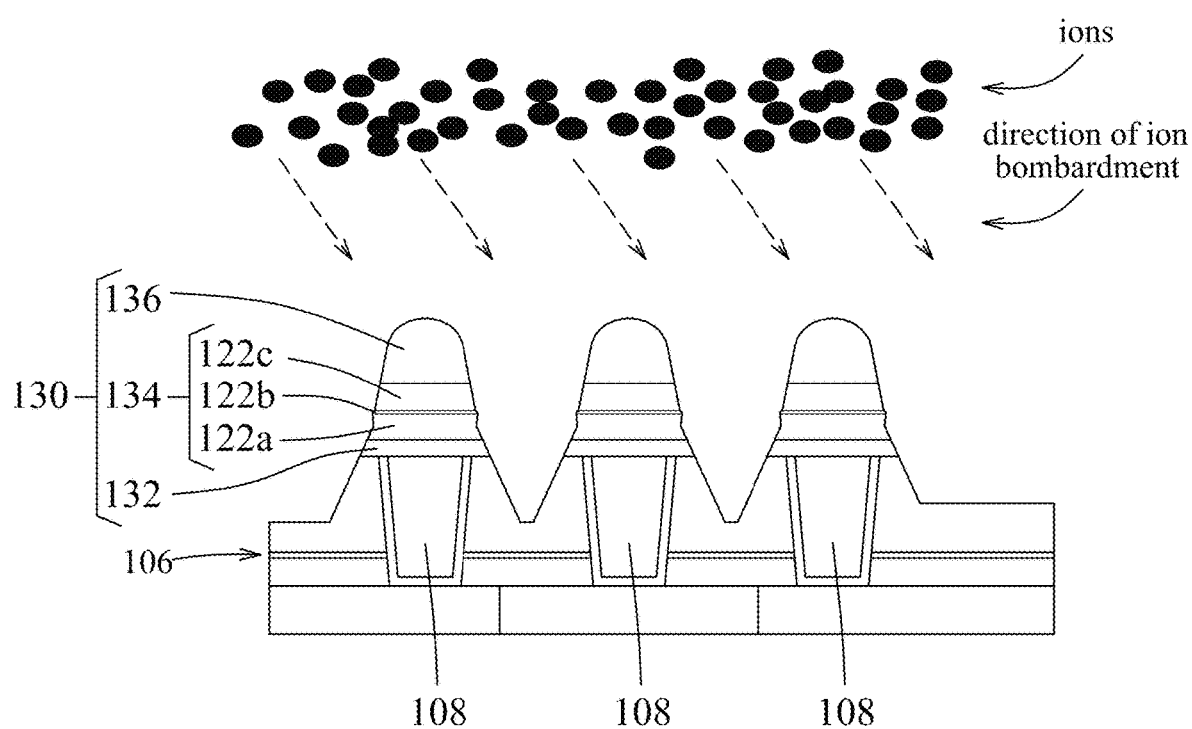
FIG. 17 is a schematic view that illustrates removal of extra substances in accordance with some embodiments.

Therefore, in some embodiments, another additional step S0A may be inserted between step S08 and step S09 to remove from the surfaces of the MRAM cells 130 the extra substances that are formed during the removal of the redeposited metal components 140 in step S08, as shown in FIGS. 16 and 17. In the illustrative embodiment, the extra substances may include, but not limited to, $CoO_x$, $FeO_x$, $B_xO_y$, $MgH_2$, $Mg(OH)_x$, $CH_x$ and $CH_xO$ polymers, and so on, which result from chemical reactions between the MTJ stacks 134 and the reactant gas used in step S08. In the illustrative embodiment, the extra substances result from chemical reactions between the MTJ stacks 134 and chemical fragments (e.g., the abovementioned H, $CH_x$, OH, O, $CH_xO_y$, H, $CH_x$, OH, O and $CH_xO_y$ fragments) that are dissociated by plasma from the reactance gas used in the RIE process. The extra substances may form damage layers on the surfaces of the MTJ stacks 134 and result in degradation of the free layer, the tunnel barrier layer and the reference layer of the MRAM cells 130. In step S0A, the extra substances are removed using an etching process that is performed mainly based on physical etching (e.g., ion bombardment), such as IBE or the like. In some embodiments, RIE or ALE may also be applicable to this step when controlled to have less chemical etching ability and more physical etching ability, so as to minimize occurrence of further chemical reaction on the MTJ stacks 134 and to remove the extra substances mainly by physical etching. In accordance with some embodiments, the etching performed in step S0A is mild compared to the etching performed in step S07, so as to avoid serious metal redeposition as may occur in step S07. To be specific, a strength or intensity of the etching performed in step S0A is smaller than that performed in step S07 in terms of the bias voltage (e.g., a smaller bias voltage) and/or the etching time (e.g., shorter etching time). In a case that RIE or ALE is used, the process may be performed using, for example but not limited to, $CH_3OH$ (also known as MeOH), F, Cl, Br, I, $SiCl_4$, $SiCl_2$, SiHCl, $SiH_2Cl_2$, $HCl_3Si$, $SiH_4$, $CH_3OH$, $C_2H_5OH$, $CH_xO_y$ (e.g., $C_3H_8O$, $C_4H_{10}O$, $C_3H_6O$, etc.), $C_xH_y$ (e.g., $CH_4$, $C_2H_6$, $C_3H_8$, $C_4H_{10}$, etc.), $Si_xCl_y$, $Si_xF_y$, $Si_xBr_y$, $Si_xI_y$, $CO_x$, $CF_x$, $CBr_x$, $O_2$, $N_2$, $H_2$, OH, other suitable gases, or any combination thereof. In a case that IBE is used, the process may be performed using, for example but not limited to, argon (Ar), chlorine (CO, fluorine (F), bromine (Br), iodine (I), helium (He), neon (Ne), krypton (Kr), xenon (Xe), radon (Rn), other suitable gases, or any combination thereof, with a bias voltage in a range from about 50 volts to about 400 volts, an etching angle in a range from about 20 degrees to about 60 degrees, an etching temperature in a range from about 25° C. to about 60° C., an etching time in a range from about 50 seconds to about 200 seconds, and RF power smaller than 800 watts, but other range values are also within the scope of this disclosure. In the illustrative embodiment, the etching of the extra substance exemplarily performed using IBE.

Figure 18:
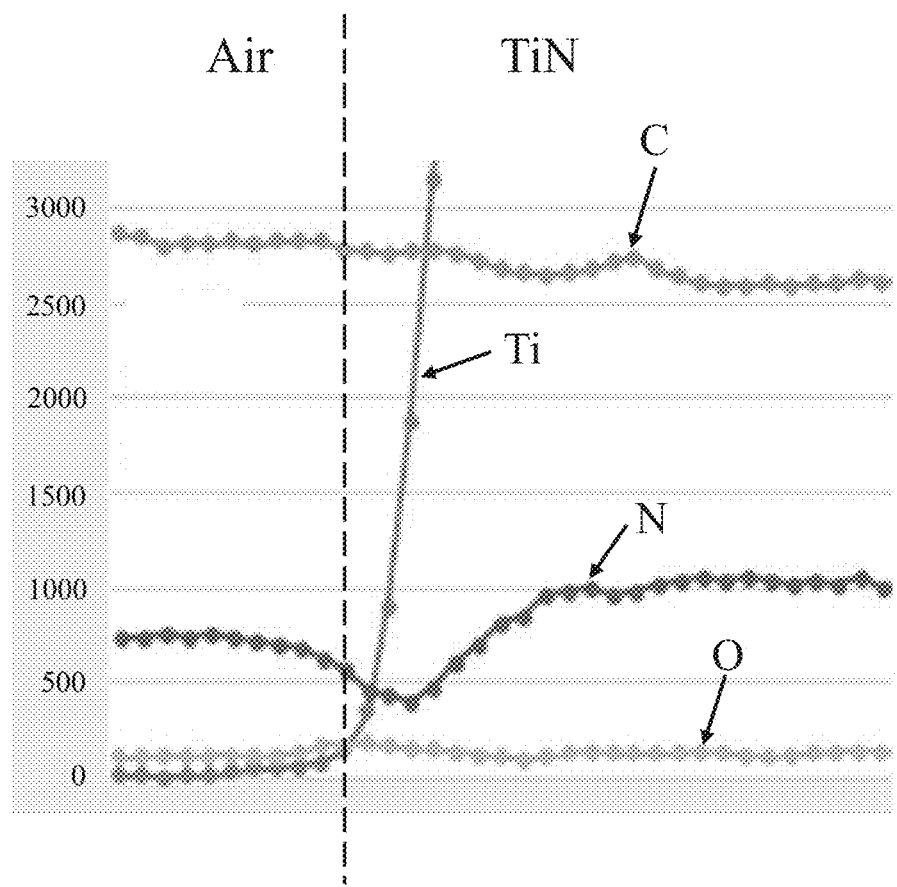
FIG. 18 is a plot that illustrates surface composition of the MRAM cells fabricated by the processes in accordance with some embodiments.

FIG. 18 shows three plots that are obtained by applying EDS on two samples of the MRAM cells 130 to analyze surface composition of the samples at the sidewall of the top electrode 136 of each of the MRAM cells 130. The left plot in FIG. 18 corresponds to the sample of which the MRAM cells 130 are formed by IBE in step S07, and which is not subsequently treated by RIE as described in step S08 or IBE as described in step S0A. The middle plot in FIG. 18 corresponds to the sample of which the MRAM cells 130 are formed by IBE in step S07, which is subsequently treated with RIE (as described in step S08) with the MeOH being used as the reactant gas, and which is not further treated with IBE as described in step S0A. The right plot in FIG. 18 corresponds to the sample of which the MRAM cells 130 are formed by IBE in step S07, which is subsequently treated with RIE (as described in step S08) with the MeOH being used as the reactant gas, and which is further treated with IBE as described in step S0A. As can be seen in FIG. 18, although the signal intensities that correspond to carbon and oxygen suddenly rise at the surface of the top electrode 136 that is made of TiN after the RIE treatment (see the middle plot of FIG. 18), the signal intensities that correspond to carbon and oxygen do not rise at the surface of the top electrode 136 after further IBE treatment (see the right plot of FIG. 18), proving that the extra substances are removed after the slight IBE trimming.

The proposed embodiments only add a further etching process after the process of removing the redeposited metal components 140 by chemical reaction, and do not require modification of the structure of the MRAM cells 130 or significant changes in the process flow, and thus the extra substances can be removed or reduced in a cost-effective manner.

In summary, in accordance with some embodiments of this disclosure, when a physical etching process (e.g., IBE) is applied to a substrate, metal components that are included in the substrate may be released and redeposited on the substrate, forming current leakage paths. In order to reduce the number of the current leakage paths, an additional process may be applied after the physical etching process to remove the redeposited metal components by chemical reaction in accordance with some embodiments. In the additional process, the metal components may be reacted to form metal compounds that are easier to be vaporized and/or that are insulating, so as to reduce the number of the current leakage paths. However, the chemical reaction may result in changes in composition or structure of the MTJ stacks 134 of the MRAM cells 130. In accordance with some embodiments, a further etching process that is performed mainly based on physical etching may be applied to remove the extra substances/extra layers that are formed by the chemical reaction.

In accordance with some embodiments of the present disclosure, a method of fabricating magnetoresistive random-access memory (MRAM) cells on a substrate that is formed with a magnetic tunneling junction (MTJ) layer thereon is provided. The MTJ layer is etched to form a plurality of MRAM cells, wherein metal components are deposited on a surface of the MRAM cells and between the MRAM cells during the etching of the MTJ layer. The metal components are removed by chemical reaction, wherein extra substances are formed during the removal of the metal components. The extra substances are removed from the surface of the MRAM cells by physical etching.

In accordance with some embodiments of the present disclosure, a method for reducing current leakage between electronic circuit elements is provided. A substrate is treated to form the electronic circuit elements therein by ion bombardment, wherein, during the ion bombardment, metal components in the substrate are released and deposited on and between the electronic circuit elements thus formed. A gas that reacts with the metal components is used to form metal compounds whose boiling point is lower than that of the metal components. The metal compounds are vaporized. Extra substances that are formed by the electronic circuit elements reacting with the gas are removed by physical etching.

In accordance with some embodiments of the present disclosure, a method for reducing current leakage between electronic circuit elements is provided. A substrate is treated to form the electronic circuit elements therein by ion bombardment, wherein, during the ion bombardment, metal components in the substrate are released and deposited on and between the electronic circuit elements thus formed. A gas that reacts with the metal components is used to form insulating metal compounds. Extra substances that are formed by the electronic circuit elements reacting with the gas are removed by physical etching.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating magnetoresistive random-access memory (MRAM) cells on a substrate that is formed with a magnetic tunneling junction (MTJ) layer thereon, said method comprising:
    etching the MTJ layer to form a plurality of MRAM cells, wherein metal components are deposited on a surface of the MRAM cells and between the MRAM cells during the etching of the MTJ layer;
    using a gas that reacts with the metal components to remove the metal components by chemical reaction, wherein extra substances are formed during the removal of the metal components and include chemical compounds that result from chemical reactions between the MTJ layer and the gas; and removing the extra substances from the surface of the MRAM cells.

2. The method of claim 1, wherein the MTJ layer is etched by ion bombardment.

3. The method of claim 1, wherein the gas reacts with the metal components to form electrically insulating metal compounds.

4. The method of claim 1, wherein the gas reacts with the metal components to form metal compounds that have a boiling point lower than a boiling point of the metal components.

5. The method of claim 1, wherein the removal of the extra substances uses ion beam etching (IBE), reactive ion etching (RIE), atomic layer etching (ALE) or any combination thereof.

6. The method of claim 5, wherein the removal of the extra substances uses the IBE that is performed using a gas of argon (Ar), chlorine (Cl), fluorine (F), bromine (Br), iodine (I), helium (He), neon (Ne), krypton (Kr), xenon (Xe), radon (Rn), or any combination thereof.

7. The method of claim 1, wherein the removal of the metal components uses reactive ion etching (RIE), and the chemical compounds result from chemical reactions between the MTJ layer and chemical fragments dissociated by plasma from the gas used for the removal of the metal components.

8. The method of claim 1, wherein the substrate is further formed with a first electrode layer over which the MTJ layer is formed, and a second electrode layer formed over the MTJ layer, and the metal components are composed of materials that are released from the first electrode layer, the MTJ layer and the second electrode layer during the etching of the MTJ layer.

9. The method of claim 8, wherein:
the first electrode layer includes tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu), or any combination thereof;
the second electrode layer includes tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu), or any combination thereof; and
the MTJ layer includes a ferromagnetic material of CoFeB, CoFeTa, NiFe, Co, CoFe, CoPt, CoPd, FePt, Ru, Ta, TaN, alloys of Ni, Co and Fe, or any combination thereof, and an insulating material including magnesium oxide, aluminum oxide, aluminum nitride, aluminum oxynitride, or any combination thereof.

10. The method of claim 8, wherein the etching of the MTJ layer is performed using a first ion beam etching (IBE) process, and the removal of the extra substances is performed using a second IBE process.

11. The method of claim 10, wherein the second IBE process has an etching time shorter than an etching time of the first IBE process.

12. The method of claim 10, wherein the second IBE process has a bias voltage smaller than a bias voltage of the first IBE process.

13. A method for reducing current leakage between electronic circuit elements, comprising:
treating a substrate to form the electronic circuit elements therein, wherein metal components in the substrate are released and deposited on and between the electronic circuit elements thus formed during the treating of the substrate;
removing the metal components by using a gas that reacts with the metal components; and
removing extra substances that are formed by the electronic circuit elements reacting with the gas.

14. The method of claim 13, wherein the gas is introduced to react with the metal components in a process of reactive ion etching (RIE), in which the gas is dissociated to generate a main product that is combined with the metal components to form the metal compounds, and a by-product that reacts with the electronic circuit elements to form the extra substances.

15. The method of claim 13, wherein the substrate is treated using a first ion beam etching (IBE) process to form the electronic circuit elements, and the extra substances are removed using a second IBE process, wherein an intensity of etching of the second IBE process is smaller than an intensity of etching of the first IBE process in terms of at least one of an etching time or a bias voltage.

16. The method of claim 13, wherein the gas reacts with the metal components to form metal compounds whose boiling point is lower than a boiling point of the metal components, and the removal of the metal components includes vaporizing the metal compounds.

17. A method for removing redeposited metal components that are formed on and between magnetoresistive random-access memory (MRAM) cells after an etching process, said method comprising:
removing the redeposited metal components by chemical reaction using a gas that reacts with the redeposited metal components, wherein extra substances are formed during the chemical reaction; and
removing the extra substances from a surface of the MRAM cells.

18. The method of claim 17, wherein the removal of the redeposited metal components uses reactive ion etching (RIE), and the extra substances include chemical compounds that result from chemical reactions between the MRAM cells and chemical fragments dissociated by plasma from the gas used for the removal of the redeposited metal components.

19. The method of claim 17, wherein the gas reacts with the metal components to form metal compounds that have a boiling point lower than a boiling point of the redeposited metal components.

20. The method of claim 17, wherein the etching of the MTJ layer is performed using a first ion beam etching (IBE) process, and the removal of the extra substances is performed using a second IBE process; and
wherein an intensity of etching of the second IBE process is smaller than an intensity of etching of the first IBE process in terms of at least one of an etching time or a bias voltage.

* * * * *